(12) United States Patent
Sivakumar et al.

(10) Patent No.: US 7,648,803 B2
(45) Date of Patent: Jan. 19, 2010

(54) DIAGONAL CORNER-TO-CORNER SUB-RESOLUTION ASSIST FEATURES FOR PHOTOLITHOGRAPHY

(75) Inventors: Sam Sivakumar, Portland, OR (US); Charles H. Wallace, Portland, OR (US); Shannon E. Daviess, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 565 days.

(21) Appl. No.: 11/390,779

(22) Filed: Mar. 27, 2006

(65) Prior Publication Data

US 2007/0224519 A1 Sep. 27, 2007

(51) Int. Cl.
*G03F 1/00* (2006.01)
*G06F 17/50* (2006.01)
(52) U.S. Cl. ............................. 430/5; 716/21
(58) Field of Classification Search ............... 430/5, 430/322, 323, 324, 394; 716/19, 20, 21
See application file for complete search history.

(56) References Cited

U.S. PATENT DOCUMENTS

| | | | | | |
|---|---|---|---|---|---|
| 6,127,071 | A | * | 10/2000 | Lu | 430/5 |
| 2005/0136336 | A1 | * | 6/2005 | Schacht et al. | 430/5 |
| 2007/0184355 | A1 | * | 8/2007 | Wallace et al. | 430/5 |

* cited by examiner

*Primary Examiner*—Stephen Rosasco
(74) *Attorney, Agent, or Firm*—Blakely, Sokoloff, Taylor & Zafman LLP

(57) ABSTRACT

Diagonal corner-to-corner sub-resolution assist features for use in photolithography are described. The diagonal features may be applied to one or a group of main features. Such features may be developed starting by synthesizing a photolithography mask having a first feature aligned along a linear axis and having a corner and a second feature aligned along a linear axis and having a corner, the corners of first and second features being separated from each other by a gap. The features may be developed by determining at least one diagonal line between the corners of the features to bridge the gap between the corners, applying a sub-resolution assist feature along the determined line, and modifying the synthesized photolithography mask to include the sub-resolution assist feature.

20 Claims, 7 Drawing Sheets

DIAGONAL CORNER-TO-CORNER SUB-RESOLUTION ASSIST FEATURES FOR PHOTOLITHOGRAPHY

FIELD

The present description relates to microelectronic and micromechanical photolithography and, in particular, to applying sub-resolution assist features on a photolithography mask at angles to bridge the corners of structures.

BACKGROUND

In the production of microelectronic and micromechanical devices, such as semiconductors, memory, processors, and controllers, among others, a mask is used. The mask is placed over a semiconductor wafer to expose or shield different portions of the wafer from light, or some other element. The exposed wafer is then processed with etching, deposition and other processes to produce the features of the various semiconductors in the wafer that make up the finished product.

The masks are designed using computer design programs that derive an aerial view or image of the wafer based on the electronic circuitry that is to be built on the wafer. The mask is designed to produce this aerial image on the wafer based on using a particular set of photolithography equipment. In other words, the mask must be designed so that when a particular wavelength of light at a particular distance is directed to a wafer through a particular set of optics and the mask, the desired pattern will be illuminated with the desired intensity on the wafer.

The pattern on the mask may be very complex and finely detailed. In some systems, a mask is designed with a matrix of pixels in columns and rows that illuminate a wafer that has an area of about one square centimeter. The mask may be four or more times that size and reduction optics are used to reduce the mask image down to the size of the wafer. For a 193 nm light source, each pixel may be about 100 nm across so that the mask may have billions of pixels. Each pixel is either a transparent spot on the mask (1), an opaque spot on the mask (0), or a transparent spot that reverses the phase of the light passing through (−1). The use of three different values (+1, 0, −1) allows for greater control over the diffractive effects through the mask.

In order to enhance the accuracy and the resolution of the pattern that results on the wafer. A variety of different optimization techniques are typically applied to the mask. One such technique is to add sub-resolution assist features (SRAF) or scattering bars to a mask. These are usually small features in the form of parallel lines or spaces that are smaller than the resolution limit of the imaging system. In other words, the features are too small to be printed on the wafer through the lens but they influence the lithographic behavior of the larger features that they are near. For example, SRAFs in the form of parallel lines running along either side of a solid line improves the focus of the solid line.

SRAFs can be used to ensure that features will be printed correctly on the wafer even as the parameters of the printing process (focus, intensity, chemistry, wafer composition, etc.) vary through their anticipated range. (The combination of these variations of the parameters of the printing process are sometimes referred to as the process window.) SRAFs have been combined with optical proximity correction (OPC), off-axis illumination (OAI), attenuated phase shifted mask (APSM) enhanced lithography, embedded phase shifted mask (EPSM) lithography, and other techniques for even more accurate photolithography.

However, for non-collinear structures, i.e. structures that are not aligned along the same line, SRAFs cannot be used between the structures. This makes it more difficult to pattern non-collinear structures that are very close together. When structures on the wafer are to be printed very close together, the mask error enhancement factor (MEEF or mask error factor MEF) tends to increase which, in turn, leads to high variations in the critical dimension (CD) for the process across the printed area. The MEEF represents how much the size of a feature printed on a mask changes in response to a change in the mask. A MEEF of 1.0 indicates that a change in the mask causes a proportional change in the final printed wafer. In other words, moving a line 4 micrometers in the mask will move the same line 1 micrometer in the printed wafer, if the lithography optics reduces the mask image on the wafer by a factor of four. When features become small enough to be near the resolution limit of the photolithography system, the MEEF increases dramatically. This means that a small change on the mask produces a very large change on the printed wafer. This makes it difficult to precisely control feature sizes. The mask design is also made more complex because different features on the same mask will have different MEEFs.

The MEEF can be reduced by using a second mask and printing some features using one mask and other features using another mask. However, this doubles the time and expense of performing the exposure. The MEEF can also be reduced using hammerhead extensions and serifs. However, when the structures are placed closer together high MEEF and CD variability can occur. In order to prevent structures from being too close together, there is normally a design rule in place for designing and for printing a mask that requires a minimum distance between the facing corners of non-collinear structures. Such a design rule limits the features and the circuits that can be made in a semiconductor, microelectronic or micromechanical device.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

For corner-to-corner gaps between structures, sub-resolution assist features (SRAFs) may be used to bridge the corners together. Diagonal bridging SRAFs may be placed at angles other than 0 or 90 degrees to bridge corners. The SRAFs improve corner rounding and allow OPC end features, such as hammerheads and serifs to be reduced in size or eliminated completely. In addition, corner pullback, reticle mask-making CD (critical dimension), and the mask error enhancement factor (MEEF) may be reduced without sacrificing the process window enhancement of the bridging SRAFs. In one embodiment, the gaps between rectangular structures at small corner-to-corner distances are bridged by a grid of crossing diagonal SRAFs. As a result, the rectangular structures may be patterned closer together. The features with a grid overlay are easier to print with controlled CDs. As a further result, corner to corner minimum distances that constrain reticle printing, by e.g. electron beam, may be overcome.

Figure 1:
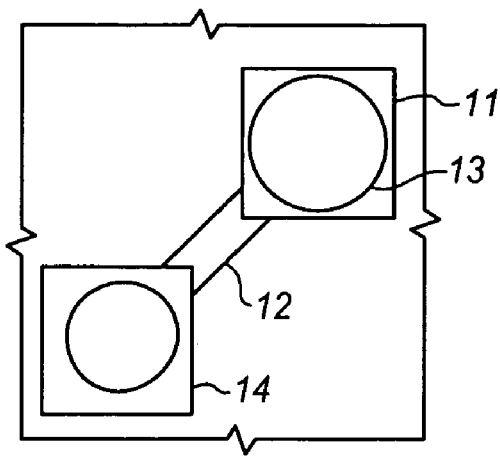
FIG. 1 is a diagram of a portion of a mask showing two main features and SRAF to bridge a corner-to-corner gap according to an embodiment of the invention.

FIG. 1 shows in a simplified diagram, a small portion of a photolithography mask with main features 11 and SRAF 12. The features of FIG. 1 are shown as examples of possible features and the shapes are simplified. Embodiments of the invention may be applied to many other types and shapes of features and to structures that are simpler and more complex than those shown. In FIG. 1, the main features are two squares 13, 14 that are near each other but not collinear. If the mask is limited to linear shapes, then the two squares fall on different lines of the mask. In FIG. 1, the shape on the mask is indicated as a square, while the shape that results from photolithography is more like a circle. This shape is shown as the circle inside the square in FIGS. 1-5.

Both squares have corners and in the example of FIG. 1, each square has a corner that roughly faces a corner of the other square. SRAF is applied between the two corners bridging this gap. In FIG. 1, SRAF is applied without concern for any keepaway distance. In many applications a design rule for a keepaway distance between features is used. The keepaway distance is applied to the distances between main features, the distances between SRAF features and the distances between main features and SRAF features. The SRAFs of FIG. 1 may be modified to accommodate the keepaway distance or other approaches may be used to work around the keepaway distance. The appropriate keepaway distance for any particular application will depend on the particular wafer, photolithography process and equipment. The smallest keepaway distance may be determined by preparing test wafers using the intended process and observing results through the process window.

The SRAF of FIG. 1 is narrower than the main features and is not collinear, nor on the same grid. Instead the SRAF is at a diagonal at a forty-five degree angle to any other line on this portion of the mask.

The size of the SRAF in FIG. 1 may be determined conventionally based on the photolithography process and the size of the various main features. Typically, SRAFs are sized so as to be below the resolution limit of the process, yet large enough to improve the resolution of the adjacent main features. SRAF sizing may be determined using a test wafer with SRAF features of varying widths and then observing the results. Typically, the largest feature that does not print though all process variations is the best size to use.

Figure 2:
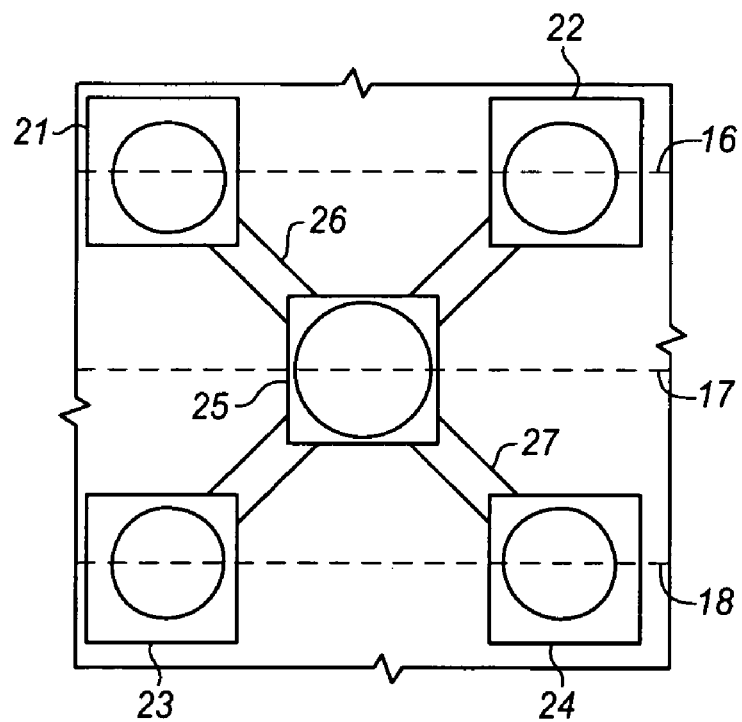
FIG. 2 is a diagram of a portion of a mask showing five main features and SRAFs to bridge corner-to-corner gaps according to an embodiment of the invention.

FIG. 2 shows a small portion of a photolithography mask that has more main features also arranged in a grid. The main features are built upon three rows 16, 17, 18, with two main features 21, 22 in the top row, two main features 23, 24 in the bottom row and a single main feature 25 in the middle row. The feature in the middle row is positioned equidistant between all of the features so that diagonal lines may be drawn through the center of the middle row feature and intersect the middles of the top and bottom row features.

SRAFs 26, 27 are applied along diagonal lines crossing the center of the central main feature. The SRAFs join each corner of the central main feature 25 to a corner of a nearby main feature 21, 22, 23, 24. As can be seen in FIG. 2, the outer main features benefit from the application of the SRAF. This is shown by the circles within each square. The square represents the mask shape and the circle represents the predicted aerial image on the wafer. The outer circles show good exposure, reduced corner rounding and reduced corner pullback as compared to what may be created without the SRAF. The central feature 25, however, shows even better results with less corner pullback and even better size.

The improved results for the central feature is in part due to the SRAFs extending away from it in four directions. This suggests that the outer features may print better if SRAFS are applied to their outer corners to extend out beyond the portion of the mask shown in FIG. 2. Such an approach to applying SRAF is shown in FIG. 3.

Figure 3:
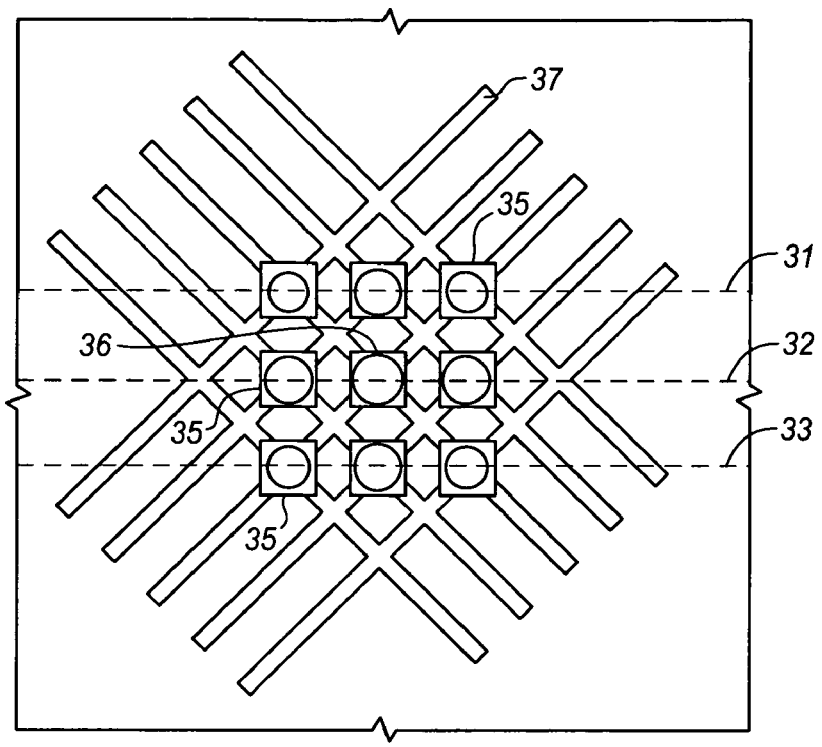
FIG. 3 is a diagram of a portion of a mask showing a grid of nine main features and a diagonal grid of SRAFs to bridge corner-to-corner gaps according to an embodiment of the invention.

In FIG. 3, the main features 35 are aligned along three rows 31, 32, 33. There are three main features per row and the main features are also aligned vertically into three columns for an even grid of nine features. SRAFs 37 extend from each of the four corners of each of the nine square main features. This goes beyond the approach of FIG. 2. In FIG. 2, SRAF was only applied to bridge the gaps between corners. In FIG. 3, SRAF is applied to extend out from corners in directions where there are no nearby main features.

As shown in FIG. 3, the SRAFS are applied along a grid of diagonal lines. Each line passes through the center of at least one main feature and the lines are at a forty-five degree angle to the grid of the main features. In order to intersect the centers of all nine main features, there are five diagonal lines at plus forty-five degrees to the grid and five perpendicular lines at minus forty-five degrees to the grid the lines always intersect in the centers of the main features but there are also intersections outside of the grid of main features. As can be seen by the circles that represent the aerial image of a wafer that might be produced by such a mask, the central feature 36 shows the best results. However, even the corner features show better results than in the example of FIG. 2 in which SRAFs were applied only between corners. The length of the SRAFs outside the grid of main features and the thickness of the SRAFs throughout the grid may be adjusted based on modeling and experimentation.

Note that the grid of main features and the grid of diagonal lines result in perpendicular SRAF lines 37 intersecting each other. Between each row of features there are two intersections of diagonal SRAF lines as those SRAF lines extend to the nearest corner. Intersections of SRAF lines also occur outside of the grid of main features as SRAF lines extend in perpendicular directions away from the outer corners of different main features. In the example of FIG. 3, the SRAF features show three intersections outside each of the four sides of the grid of main features. All of this detail in the SRAFs enhances the aerial image on the wafer. The effect is similar to that of dense patterning all around the main features. It is as if the isolated small grouping of features are nested in a more complex and dense pattern of features. The result is higher contrast and fuller corners with need for OPC serifs and hammerheads.

Figure 4A:
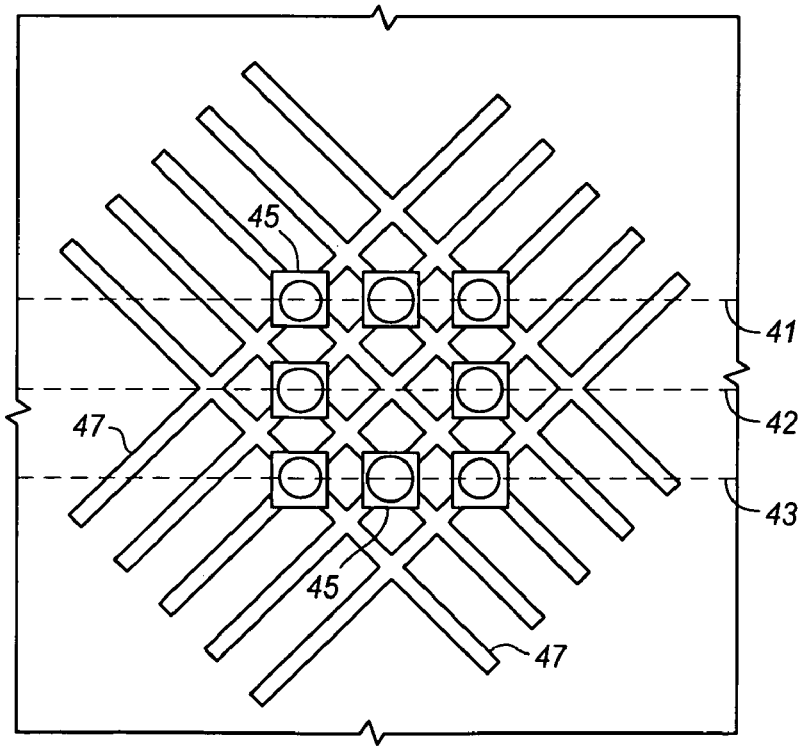
FIG. 4A is a diagram of a portion of a mask showing a diagonal grid of SRAFs similar to that of FIG. 3 applied to the corners of a grid of eight main features according to an embodiment of the invention.

FIGS. 4A through 4D show the same grid of diagonal SRAFs as in FIG. 3 but applied to different patterns of main features. In FIG. 4A, the same rectangular array of square features 45 is present in the same three horizontal rows 41, 42, 43 and three vertical columns. In, contrast to FIG. 3, the central main feature is absent so that there are only two main features in the middle row, the outer features. Nevertheless, the same grid of five intersecting diagonal lines is used as in FIG. 3. The SRAFs 47 connecting the inner corners of the four outer main features intersect in the center of the grid. As in FIG. 3, this greater pattern density enhances the aerial image from the wafer and accordingly, the resulting final printed wafer.

Figure 4B:
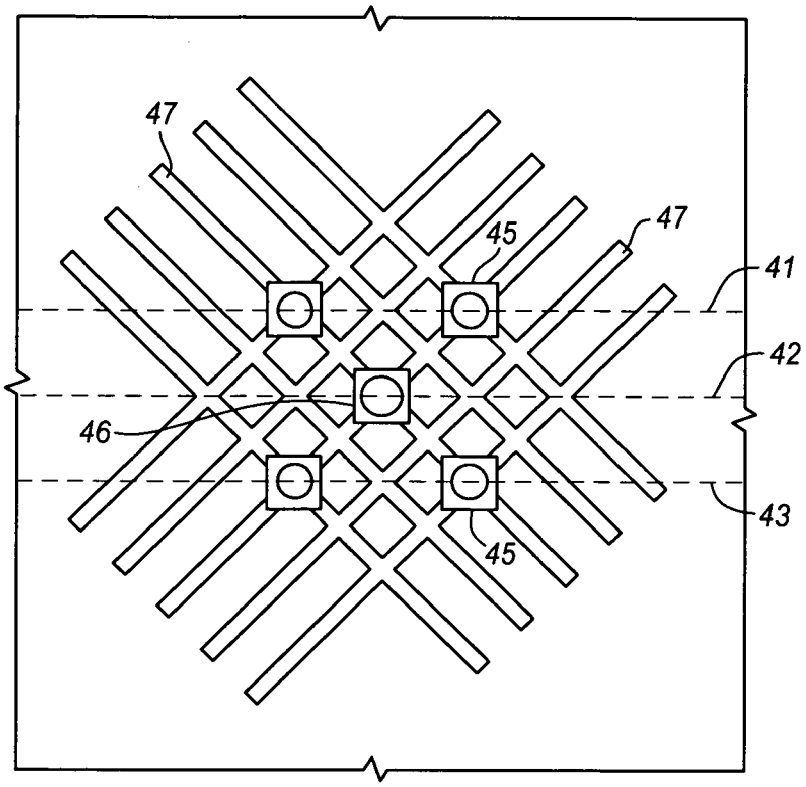
FIG. 4B is a diagram of a portion of a mask showing a diagonal grid of SRAFs similar to that of FIG. 3 applied to the corners of a grid of five main features according to an embodiment of the invention.

In FIG. 4B, there are only five main features 45, 46 in the grid. The pattern is essentially the same as that of FIG. 2. The central feature 46 has returned but the central feature in the top and bottom rows is removed. The outer features in the middle row are also removed. The same grid of five diagonal lines in two perpendicular directions is used as in FIGS. 3 and 4A. SRAFs 47 on these diagonal lines are allowed to intersect all around the main features, creating a denser pattern of SRAFs than in FIG. 2. This produces better results when the spacing between the main features is great enough to allow such a dense pattern of SRAFS.

Figure 4C:
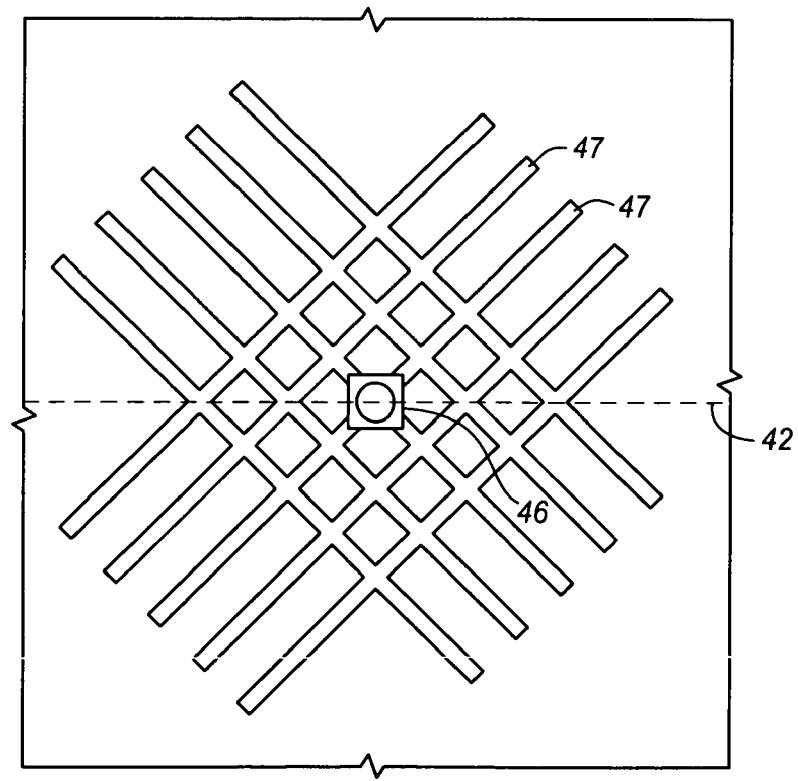
FIG. 4C is a diagram of a portion of a mask showing a diagonal grid of SRAFs similar to that of FIG. 3 applied to the corners of a single isolated main feature according to an embodiment of the invention.

FIG. 4C shows an example of a pattern that is otherwise very difficult to print onto photoresist using conventional OPC techniques. In FIG. 4C, a single polygon 46 is placed in an isolated position with no other features nearby. A single row line 42 indicates a reference for the alignment and centering of the diagonal lines. By applying the same grid of diagonal lines as in FIGS. 2, 4A, and 4B around the isolated feature and then adding SRAF 47 on all of these lines, however, the isolated feature prints well. As in the other figures, the mask pattern is indicated by the square and the resulting aerial image is indicated by the rough circle within the rectangle. As can be seen, even without any other nearby features, the mask pattern will print roughly as a circle. The size of the circle may be adjusted in OPC to obtain the necessary dimensions.

Figure 4D:
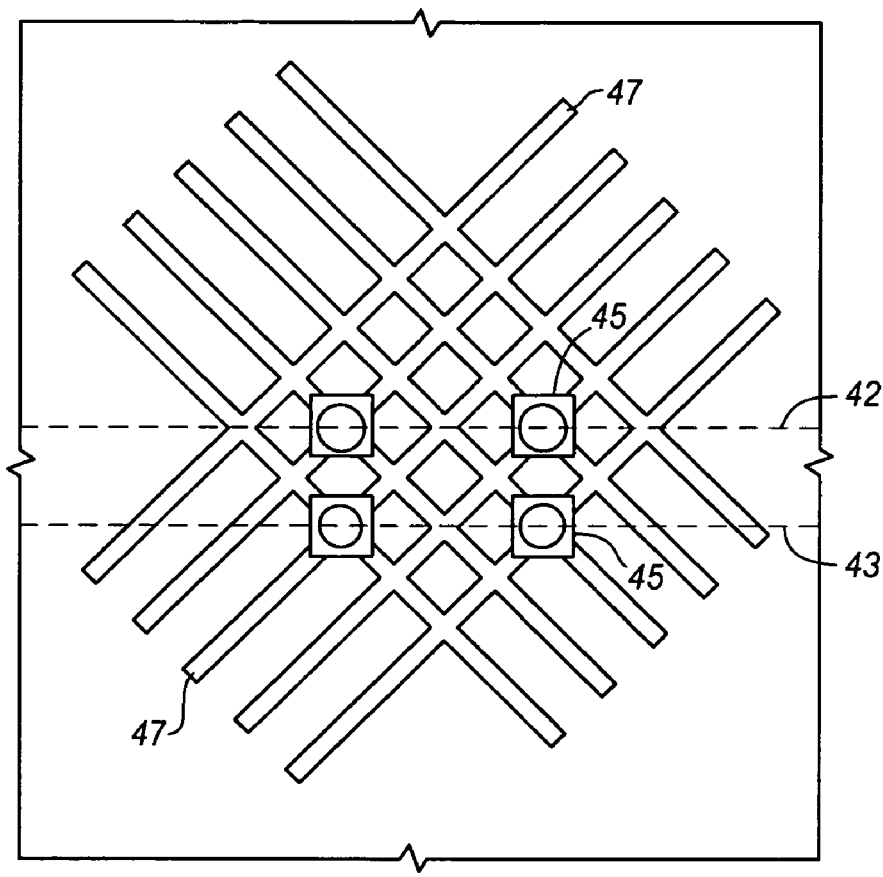
FIG. 4D is a diagram of a portion of a mask showing a diagonal grid of SRAFs similar to that of FIG. 3 applied to the corners of a grid of four centrally offset main features according to an embodiment of the invention.

In the example of FIG. 4C, the main feature is centered in the grid of diagonal SRAF features. However, the main feature may be placed in another location on the grid in order to accommodate other nearby features. FIG. 4D shows an offset positioning of main features. In FIG. 4D there are two rows 42, 43 of two features 45. The diagonal grid of SRAFs in, for example FIG. 3 is applied as if the top row of features is absent and as if the center feature in the two lower rows is also absent. Accordingly, while the lower four lines of SRAFs 47 in each diagonal group intersect corners of main features, the top line in each diagonal group does not meet any features. In another embodiment, an additional diagonal line of SRAF may be added to each diagonal group so that there are six diagonal lines and the lowest line in each direction also does not meet with any of the four main features. This can provide a larger area of dense patterning that may further enhance the aerial image.

The same pattern of four SRAFs might be handled as shown, for example, in FIG. 4B but without the central feature. Alternatively, the grid of diagonal lines may be placed farther apart so that the SRAF lines do not intersect in between the features. The configuration of FIG. 4D demonstrates that significant benefits may be obtained even when the main features are offset from the pattern of diagonal SRAFs. The SRAF grid may be offset in order to accommodate nearby features or in order to add patterning to an otherwise open area of the mask.

While the array of diagonal SRAFs in each of FIGS. 4A to 4D has the same shape based on five diagonal lines, the array may be varied to suit particular applications. FIGS. 4A to 4D demonstrate how an array may be applied to many different configurations of main features. A different array may also be applied to the same and different configurations of main features. More or less diagonal lines in each direction may be used. As shown in FIGS. 4C and 4D, the pattern of SRAFs may extend beyond the pattern of main features. In addition, the lines may intersect at other angles. Perpendicular lines are well-suited to many mask design tools and forty-five degree angles provide for simpler calculations and representations, however, the lines need not be perpendicular. In one embodiment, the lines are at sixty degree angles and cross at angles of sixty and one hundred twenty degrees. Other angles may alternatively be used and it is not necessary that both sets of diagonal lines be at the same angle to the rectangular grid of the main features.

Figure 5:
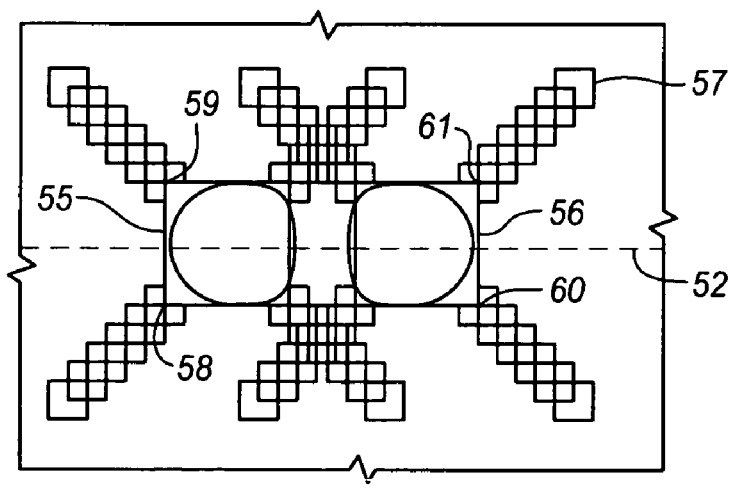
FIG. 5 is a diagram of a portion of a mask showing a diagonal grid of SRAFs applied to the corners of two collinear main features according to an embodiment of the invention

FIG. 5 shows a further application of diagonal lines to form SRAFs between two features. In FIG. 5, the two main features 55, 56 are arranged parallel and collinearly along a horizontal line 52. The two features are joined corner-to-corner by diagonal SRAFs 57 that intersect above and below the horizontal line 52 along the main features. The SRAFs also have a length that extends a little beyond the intersection. Similar features are applied to the distal corners 58, 59, 60, 61 of the two main features. In other words, each of the two main features has a diagonal SRAF extending from each of its four corners. Between the two main features these SRAFs intersect. On the opposite corners, the SRAFs extend into an open area away from the main features. As can be seen by the rough circles within the squares, this simple pattern of SRAFs provide a much better aerial image than might otherwise be obtained. A pair of collinear features may alternatively be enhanced with a more complex pattern, such as that shown in FIG. 4D, however, the design rules may not allow for such complexity in some instances.

The sizes of the SRAFs as well as their lengths may be carefully tuned based on the local proximity of neighboring features. The optimal SRAF position, length, and sizing may be determined based on at least three criteria. First, the SRAF may be selected to be small enough that the image intensity created from the SRAF does not create a pattern in the photoresist during exposure. In one example, the threshold intensity for the SRAF needs to be less than or equal to about 70% of the target intensity of the main feature. The extra 30% margin ensures that no feature will be printed across process variations. Second, the SRAF may be selected to be large enough to improve the process window of an isolated feature so that it is close to that of the same size nested feature. In other words, SRAF is large enough to enhance the contrast of the aerial image of the main feature by some desired amount.

Third, the addition of the SRAF should not significantly increase the mask error enhancement factor of the features or go beyond the resolution limits of the reticle manufacturing process. Additional criteria and design rules may be taken into consideration depending on the particular application.

In order to improve the use of SRAFs in end-to-end regions, a useful size range for SRAFs may be established based for example, on the criteria mentioned above. For such a range the lower limit of SRAF size may be set to the minimum size producible on the mask that still increases the aerial image contrast of the main features. The maximum size may be set by the highest image intensity that will not produce an image on the photoresist reduced by some margin, for example the 30% margin mentioned above.

While the drawings all show SRAFs of one consistent line width. A consistent line width is not necessary. Using a minimum and a maximum size, the width of any SRAF may be varied depending on the application. For example, this minimum size may be used on all structures where the SRAF connects with the main features. The minimum size minimizes the MEEF of the end-to-end regions. The maximum size SRAF may be attached in regimes where the end-to-end distance is greater than, for example, about 5 times the width of the main features. The minimum size SRAF may also be attached directly to the main feature for a period of about the line width and then immediately increased to the maximum value of the SRAF range. The size of the features may be optimized through OPC, through experimentation or in other ways.

As to the length of the SRAFs, these may also be tuned by simulation and experimentation. For SRAFs that connect corners, the SRAFs extend from one corner to the next. For the SRAFs that extend away from corners into regions that do not have a nearby corner, the length of the extension will depend upon the shape and size of the main features and nearby SRAFs as well as the parameters of the process being applied. The figures show a length, shape and size of grid that may be useful for a 193 nm process using square features that are about 80 nm per side and 80 nm apart. For other technologies and other materials and 193 nm processes, other lengths of SRAFs may perform better.

In the examples shown in the figures, SRAFs and features are mapped onto a regular rectangular grid. This allows corners to be connected with straight diagonal lines. However, the same approach may be applied to layouts in any shape or form in which two features are positioned at close proximity.

As mentioned above, the best sizes for SRAFs may be determined empirically, by exposing test wafers with different sized features and different sized SRAFs and then examining the results. Additional test portions of the wafer may be used to evaluate the impact of the SRAFs on MEEF. Different tests may be performed for different processes. The most suitable dimensions may vary with different types of wafers, different types of photo-resists, different types of scanners, different types of masks, different sizes and shapes for main features, different chemistry, timing, temperatures, etc. In one example using EPSM with 193 nm illumination and main features widths of about 80 nm, SRAF features may be from about 20 nm wide to about 50 nm wide.

Another approach to determining appropriate sizes for SRAFs is to use process simulation software. This type of software typically produces a simulated aerial image for a particular simulated wafer pattern and then estimates the resulting pattern that would be printed on a semiconductor wafer. Such software allows different size SRAFs to be analyzed with different main feature configurations. The simulation software may be used together with empirical results in different ways to determine optimal SRAF sizes.

Figure 6:
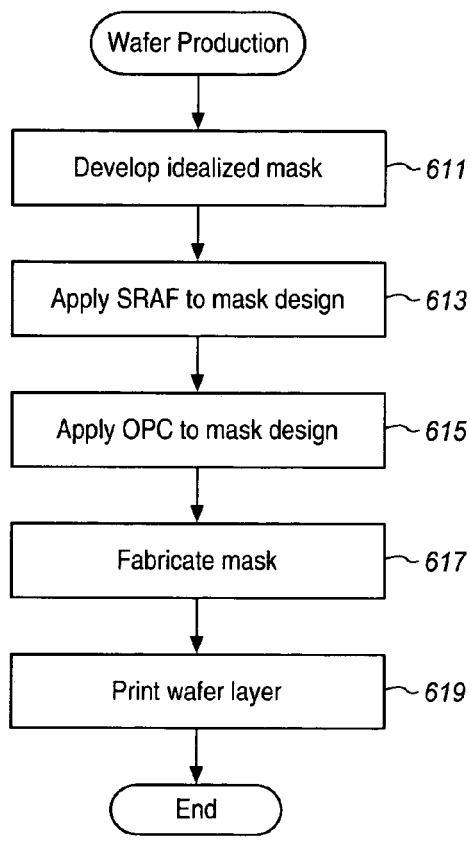
FIG. 6 shows an example of a wafer production process according to an embodiment of the present invention.

FIG. 6 shows an example of a wafer production process according to an embodiment of the invention. In FIG. 6, an idealized mask is developed at block 611. The idealized mask has all of the features that are desired to be printed on the wafer. Typically in such an idealized mask, the features have a shape that assumes that the printing accurately follow the shapes of the mask. However, the mask may already be optimized and adjusted according to any of a variety of different techniques.

SRAFs are applied to the idealized mask design at block 613. An example of such an application of SRAFs is described below in association with FIG. 7. In one example, SRAFs are applied in differing sizes depending on the shape, size and proximity of the main features.

OPC is applied to the mask design at block 615. OPC may be applied before or after the SRAFs are applied or both. In one embodiment, the mask design is developed using iterations of the aerial image until the printed result is optimized. The iterations may apply different types or amounts of SRAFs and OPC. In one embodiment, the application of SRAFs is incorporated into the OPC process. Alternatively, different or additional mask enhancement or improvement processing may be used. OPC may be replaced with other techniques, depending on the particular application.

At block 617 a real mask is fabricated based on the modified mask that results from the operations of block 615 and at block 619, a wafer is printed using photolithography and the fabricated mask. The wafer may be a semiconductor circuit, a micro-machine or any other microelectronic device.

Figure 7:
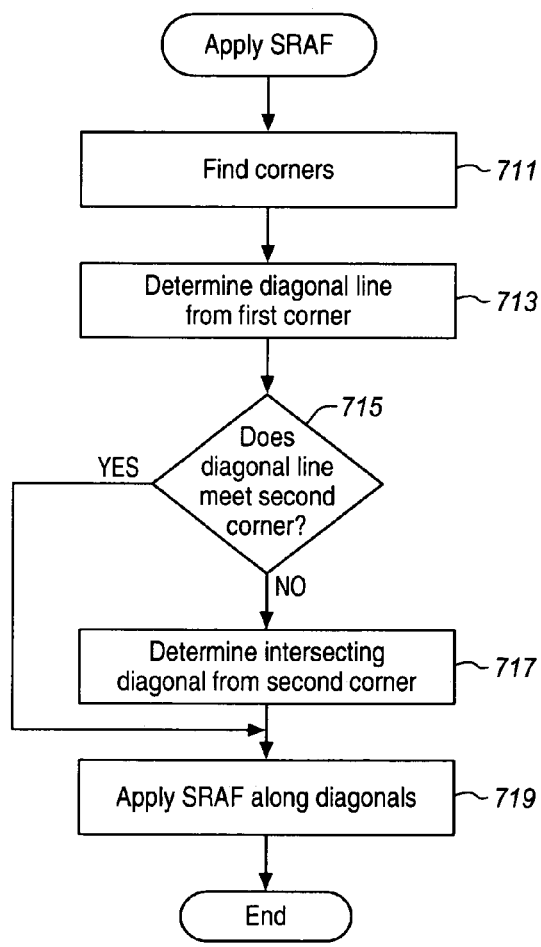
FIG. 7 shows an example of a process of applying SRAF to a mask design according to an embodiment of the present invention.

FIG. 7 shows an example of a process of applying an SRAF to a mask design according to an embodiment of the invention. Such a process may be applied to block 613 of FIG. 6. Initially, the corners of any two main features in the idealized mask are found at block 711. Such corners are shown, for example in FIGS. 1, 2, 3, 4A through 4D, and 5. Selecting one such corner, a diagonal line is determined from the selected corner toward a corner of the other feature at block 713. If the features are in a grid, then the diagonal line may be selected at a predetermined angle like the forty-five degree angles of the examples described above. For other configurations of main features, other angles may be selected. While this example is presented in the context of elongated features in a grid with corners that are positioned near each other. The same technique may be applied to features of other shapes and features that are not in a grid.

At block 715, the diagonal line is analyzed to determine whether it meets a corner of the other feature. If the spacing of the features and angle of the diagonal is appropriate, then the diagonal should bridge the gap between corners of the features. Such a situation is shown, for example, in FIGS. 1, 2, and 3. However, for many situations the position of the relative corners or design constraints on the diagonals will prevent a diagonal from meeting two corners. In this situation, another diagonal is determined at block 717 that extends from a selected corner of the other feature and intersects the first diagonal. Such a situation is shown, for example in FIGS. 4D and 5. Additional diagonals may be added to build up a variety of different intersecting grid arrangements in order to further enhance the resulting aerial image.

With the diagonals meeting both corners, SRAF is applied to the mask along the diagonal lines between the features at block 719. Additional operations may be added to FIG. 7 to select the size, shape and configuration of applied SRAF or to accommodate other factors.

In the examples above, diagonal lines are drawn through corners at angles that intersect with other corners. SRAFs are then applied along those diagonal lines. In all of the examples, the features are aligned in a rectangular grid and the diagonal lines are drawn at forty-five degrees to the grid lines. The diagonal lines may however be placed at other angles such as thirty-five, sixty or any other number of degrees from the rectangular grid. The best angle will depend upon the configuration of the main features and the particular application. In addition, SRAFs may be applied not only upon diagonal lines that bridge the gaps between corners but also upon diagonal lines that extend outward from corners toward no particular main features.

In addition, a gridwork of diagonal lines may be used to create effects on the wafer similar to dense patterning even when there is only one or a few isolated features in an area of the mask. Using a gridwork of diagonal lines may allow other types of OPC features to be skipped over. For example, in some simulations, the gridwork provides results so good that hammerheads and serifs or other OPC features do not improve the results. Alternatively, the results from a gridwork of diagonal lines may in some applications be improved by adding hammerheads and serifs.

As shown from the figures, the diagonal lines extend from the corners of main features. The main features in the drawings are all shown as squares, however, embodiments of the invention may be applied to other main features with corners including other types of quadrangles, rectangles, parallelograms and many other types of polygons. Embodiments of the present invention may also be applied to main features that do not have well-defined corners, such as curved shapes.

Figure 8:
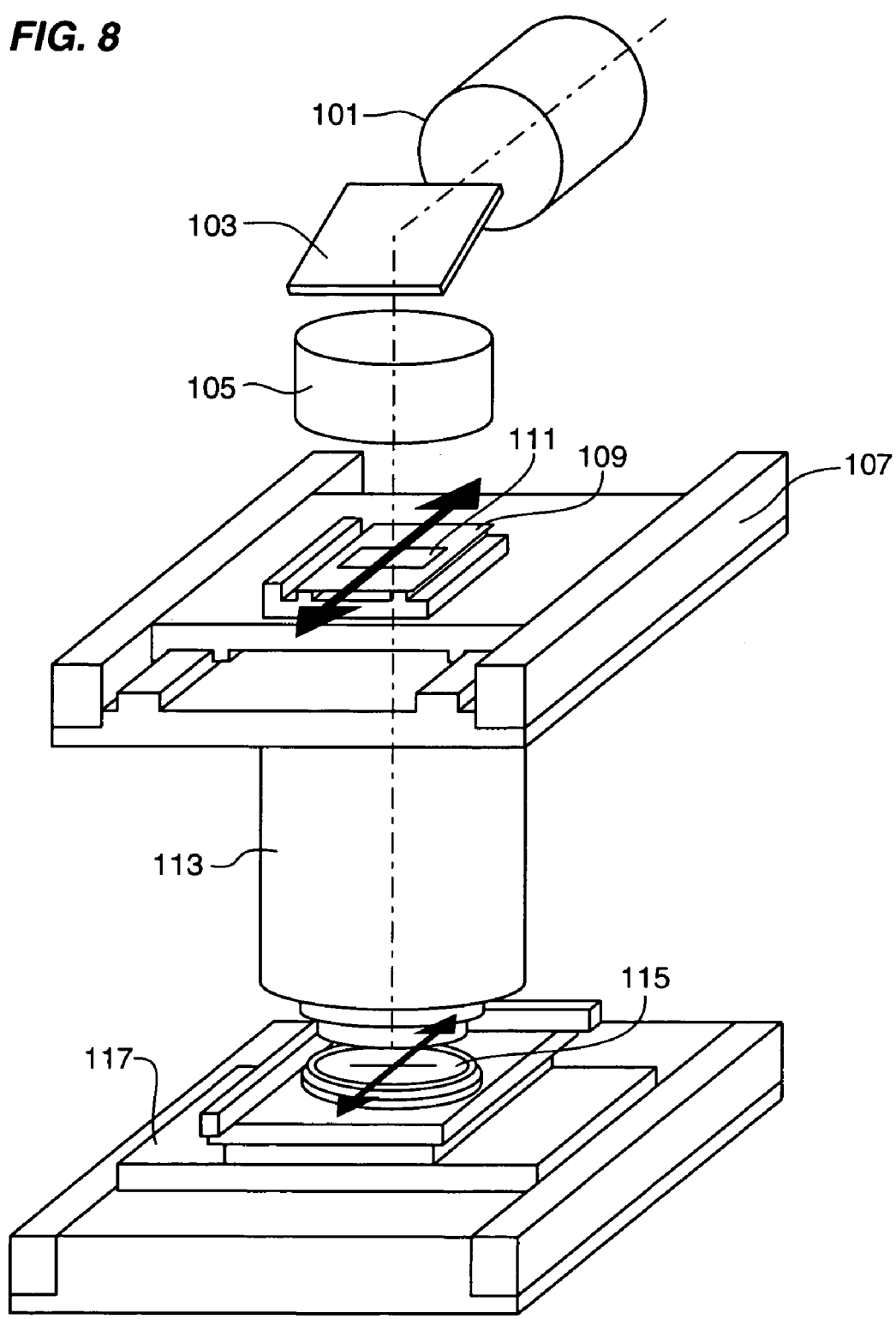
FIG. 8 is a diagram of a semiconductor fabrication device suitable for application to the present invention.

FIG. 8 shows a conventional semiconductor fabrication machine, in this case, a lens-scanning ArF Excimer Laser Stepper, that may be used to hold a mask or produce a wafer in accordance with embodiments of the present invention. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four-fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 8 is an example of a fabrication device that may benefit from embodiments of the present invention. Embodiments of the invention may also be applied to many other photolithography systems.

The mask controls the size of each feature on the wafer. The mask design is made up of chrome metal lines, molybdenum silicide lines, or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design.

Figure 9:
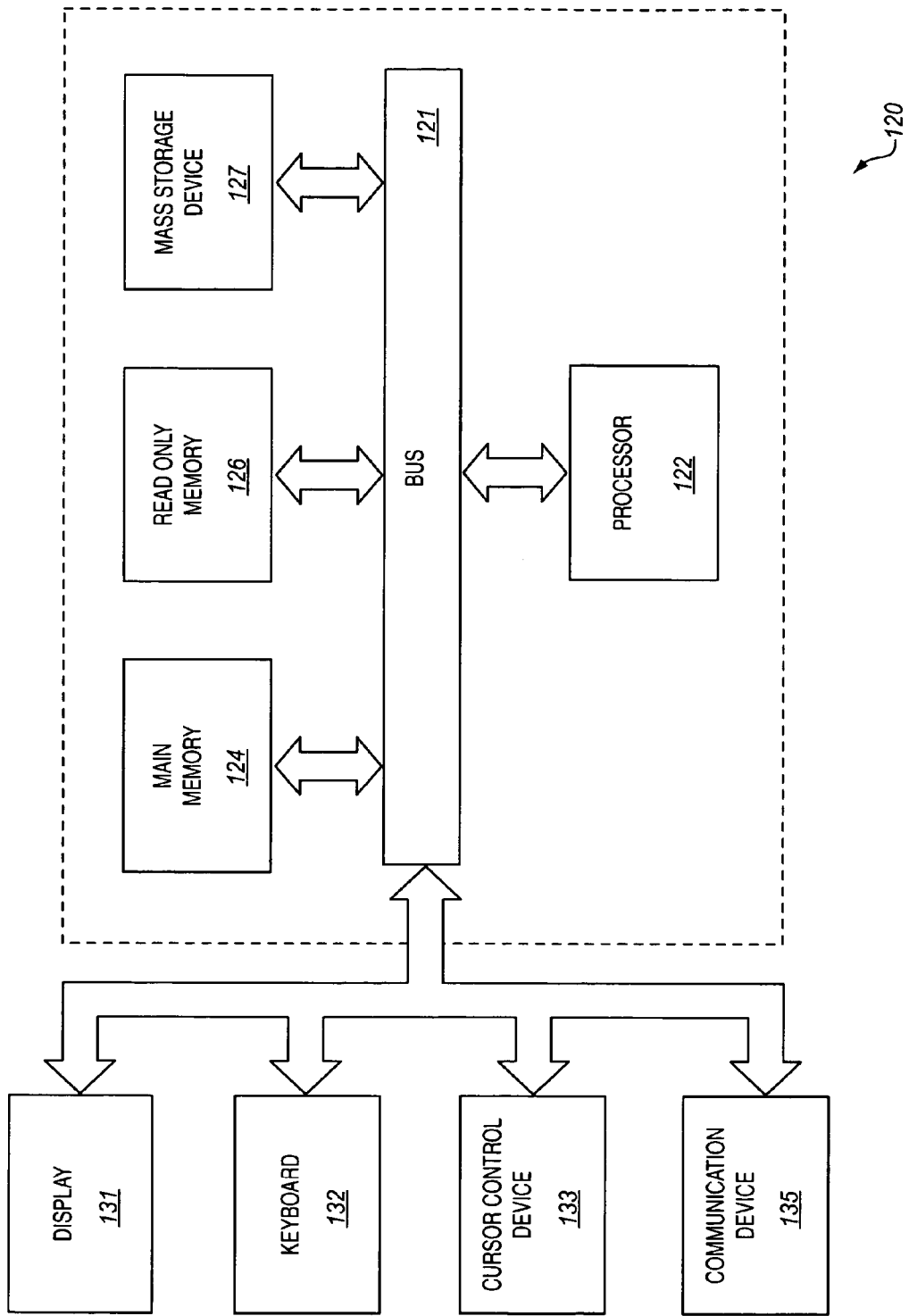
FIG. 9 is an example of a computer system capable of performing aspects of the present invention.

FIG. 9 shows a computer system 120 representing an example of a system upon which features of the present invention may be implemented. The computer system 120 includes a bus or other communication means 121 for communicating information, and a processing means such as a microprocessor 122 coupled with the bus 121 for processing information. The computer system 120 further includes a main memory 124, such as a random access memory (RAM) or other dynamic data storage device, coupled to the bus 121 for storing information and instructions to be executed by the processor 122. The main memory also may be used for storing temporary variables or other intermediate information during execution of instructions by the processor.

The computer system may also include a nonvolatile memory 126, such as a read only memory (ROM) or other static data storage device coupled to the bus for storing static information and instructions for the processor. A mass memory 127 such as a magnetic disk or optical disc and its corresponding drive may also be coupled to the bus of the computer system for storing information and instructions.

The computer system may also be coupled via the bus to a display device or monitor 131, such as a Liquid Crystal Display (LCD), for displaying information to a user. For example, graphical and textual indications of installation status, operations status and other information may be presented to the user on the display device. Typically, an alphanumeric input device 132, such as a keyboard with alphanumeric, function and other keys, may be coupled to the bus for communicating information and command selections to the processor. A cursor control input device 133, such as a mouse, a trackball, or cursor direction keys may be coupled to the bus for communicating direction information and command selections to the processor and to control cursor movement on the display 131.

A communication device 135 is also coupled to the bus 121. The communication device 135 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

It is to be appreciated that a lesser or more equipped computer system than the example described above may be preferred for certain implementations. Therefore, the configuration of the exemplary computer system 120 will vary from implementation to implementation depending upon numerous factors, such as price constraints, performance requirements, technological improvements, or other circumstances. Such a computer system may be used to perform simulations described above, and to generate or modify a mask as described above. In addition any of the microelectronic components of the computer system may be produced using a mask having SRAFs as described above.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex main feature set, mask layout, SRAF configuration, optimization process and photolithography process or system may be used than those shown and described herein. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
   synthesizing a photolithography mask having a first feature aligned along a linear axis and having a corner and a second feature aligned along a linear axis and having a corner, the corners of first and second features being separated from each other by a gap;
   determining at least one diagonal line between the corners of the features to bridge the gap between the corners;
   applying a sub-resolution assist feature along the determined line; and
   modifying the synthesized photolithography mask to include the sub-resolution assist feature.

2. The method of claim 1, wherein the first and second features are rectangular and offset from one another and wherein determining a diagonal line comprises determining a line that extends from a nearest corner of the first feature to a nearest corner of the second features.

3. The method of claim 2, wherein the first and second features are collinear and wherein determining a diagonal line comprises determining a first diagonal line that extends from a nearest corner of the first feature and determining a second orthogonal diagonal line that extends to a nearest corner of the second feature and intersects the first line.

4. The method of claim 1, further comprising applying optical proximity correction to the synthesized mask.

5. The method of claim 1, wherein the mask has a grating pattern of alternating lines and spaces and wherein the sub-resolution assist feature is applied diagonally to the lines.

6. The method of claim 4, wherein the two features are elongated along distinct non-collinear line segments and the sub-resolution assist feature extends diagonally from one line segment to the other.

7. The method of claim 1, wherein determining at least one diagonal line comprises determining a grid of intersecting orthogonal diagonal lines that intersect the corners of the two features, the grid of diagonal lines intersecting also outside the first and second features.

8. An apparatus comprising a machine-readable medium having instructions which when executed by a machine cause the machine to perform operations comprising:
   synthesizing a photolithography mask having a feature with a corner;
   determining a grid of intersecting diagonal lines that extend from the at least one corner to create a dense patter in surrounding the feature;
   applying a sub-resolution assist feature along the diagonal lines; and
   modifying the synthesized photolithography mask to include the sub-resolution assist feature.

9. The apparatus of claim 8, wherein the mask has a grating pattern of alternating lines and spaces and wherein the sub-resolution assist feature is applied diagonally to the lines.

10. The apparatus of claim 8, wherein the synthesized mask has at least two features, each with a corner and wherein determining a grid of intersecting diagonal lines comprises determining a grid that intersects the corners of the two features, the grid of diagonal lines intersecting also outside the first and second features.

11. A mask comprising:
    a first feature aligned along a linear axis and having a corner;
    a second feature aligned along a linear axis and having a corner, the first and second features being separated from each other by a gap;
    a sub-resolution assist feature between a corner of the first feature and a corner of the second feature, the sub-resolution assist feature being aligned along a line that is offset at angle from the linear axis of the first feature.

12. The mask of claim 11, wherein the mask has a grating pattern of alternating lines and spaces, wherein the linear axes of the first and second features are aligned with the grating pattern and wherein the sub-resolution assist feature is applied at a diagonal to the grating pattern.

13. The mask of claim 11, wherein the linear axes of the first and second features parallel but non-collinear and the sub-resolution assist feature is extends diagonally from the one linear axis to the other.

14. The mask of claim 11, wherein the sub-resolution assist feature comprises a grid of linear features arranged diagonally to the linear axes of the first and second features.

15. A microelectronic device produced using the photolithography mask of claim 11.

16. The device of claim 15, wherein the sub-resolution assist feature comprises intersecting lines diagonal to the linear axes of the first and second features.

17. The device of claim 15, wherein the two features are aligned along collinear line segments and the sub-resolution assist feature comprises at least two diagonal line segments that intersect offset from the collinear line segments.

18. A computer system comprising:
    a system bus;
    a system memory coupled to the bus; and a microelectronic device coupled to the bus, the microelectronic device being produced using the photolithography mask of claim 11.

19. The system of claim 18, wherein the first feature and the second feature correspond to transistors of the microelectronic device.

20. The system of claim 18, wherein the first and second features comprise rectangles arranged in an orthogonal grid and wherein the sub-resolution assist feature comprises a grid of intersecting linear features that are diagonal to the grid of the first and second features.

\* \* \* \* \*

UNITED STATES PATENT AND TRADEMARK OFFICE
CERTIFICATE OF CORRECTION

PATENT NO. : 7,648,803 B2 Page 1 of 1
APPLICATION NO. : 11/390779
DATED : January 19, 2010
INVENTOR(S) : Sivakumar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 863 days.

Signed and Sealed this

Twenty-eighth Day of December, 2010

David J. Kappos
*Director of the United States Patent and Trademark Office*